US007046105B2

(12) United States Patent
Overal

(10) Patent No.: US 7,046,105 B2
(45) Date of Patent: May 16, 2006

(54) SYSTEM AND METHOD FOR THREADED PLUNGER ASSEMBLY

(75) Inventor: Robert K. Overal, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/232,793

(22) Filed: Sep. 22, 2005

(65) Prior Publication Data

US 2006/0017528 A1 Jan. 26, 2006

Related U.S. Application Data

(62) Division of application No. 10/638,992, filed on Aug. 11, 2003.

(51) Int. Cl.
*H03J 3/22* (2006.01)

(52) U.S. Cl. ...................... 333/232; 333/209; 333/226; 333/235

(58) Field of Classification Search ................ 333/263, 333/209, 223, 224, 226, 231, 232, 235, 233
See application file for complete search history.

(56) References Cited

U.S. PATENT DOCUMENTS

| | | | | |
|---|---|---|---|---|
| 2,557,686 | A | | 6/1951 | Rado |
| 3,311,839 | A | * | 3/1967 | Rutulis ....................... 333/232 |
| 4,647,883 | A | | 3/1987 | Oxley |

* cited by examiner

*Primary Examiner*—Stephen E. Jones
(74) *Attorney, Agent, or Firm*—Peter K. McLarty; W. James Brady, III; Frederick J. Telecky, Jr.

(57) ABSTRACT

A system and method for a plunger assembly includes a tuning slug with a bore in the stem, a tuning screw rotatably disposed in the stem, and a coupling assembly to rotatably secure the tuning screw to the slug. The system and method may also include a locking assembly to secure the postion of the assembly.

7 Claims, 2 Drawing Sheets

SYSTEM AND METHOD FOR THREADED PLUNGER ASSEMBLY

This application is a divisional of application Ser. No. 10/638,992, filed Aug. 11, 2003.

TECHNICAL FIELD OF THE INVENTION

This invention relates to waveguide volume adjustment, and more particularly, to a system and method for manufacturing a threaded, fine-tune waveguide volume assembly.

BACKGROUND OF THE INVENTION

Microwave asher assemblies for the manufacture of semiconductor devices are typically manufactured with waveguides designed to resonate microwaves to ignite a plasma source for semiconductor ashing. To ensure that the waveguide length is appropriate for a power setting, ashers may be equipped with a tuning slug at one end of the waveguide. This tuning slug allows an operator to somewhat control the length of the waveguide, thus reducing the amount of reflected power within the waveguide to increase ensuring maximum efficiency of the energy used to excite the plasma.

Adjustment of the tuning slug typically is performed by a set screw assembly that must be adjusted by hand in a way that is cumbersome, imprecise, and in some cases dangerous. Generally, a stem of the tuning slug is inserted through an opening in the end of the waveguide and is secured by a set screw through the opening to lock the tuning slug into position. When a changed waveguide length is desired, for example due to a change in the power setting, an operator must loosen the set screw and adjust the tuning slug either by hand, by tapping with a hammer, or by some other imprecise means. Typically, after each adjustment, an operator must turn on the power of the waveguide assembly, check the reflected and transmitted power measurements of the waveguide, turn off the microwave generator of the asher and readjust the tuning slug based on the previous readings of power reflection in transmission. This process is then repeated until a certain level of reflected power is achieved. This method of adjusting the tuning slug often results in a large amount of microwave energy escaping the waveguide, which presents health concerns to individuals, particularly those with pacemakers or other devices sensitive to microwave radiation. Furthermore, repeated loosening and tightening of the set screw against the stem of the tuning slug causes damage to the tuning slug and may result in costly replacement of the slug.

SUMMARY OF THE INVENTION

Among other things, the present invention addresses the problem of fine tuning the volume of a waveguide system for a microwave asher. According to various embodiments of the invention, there are provided a threaded slug assembly and a method for manufacturing a threaded slug assembly, which allows for fine tuning of the waveguide volume for a microwave asher.

One embodiment of the present invention provides for a method of manufacturing a slug assembly that includes, among other things, creating a bore in the stem of a tuning slug and rotatably coupling a partially threaded tuning screw to the tuning slug so that the tuning screw may adjust the position of the tuning slug within a waveguide assembly. Yet another embodiment provides for a waveguide assembly having a waveguide, a tuning slug with a stem, a tuning screw rotatably coupled to the tuning slug within a bore in the stem by a coupling assembly, and a locking assembly to maintain the position of the tuning slug within the waveguide.

Various embodiments of the present invention provide various advantages over traditional tuning slugs and the manufacture thereof. It should be noted that any given embodiment of the present invention may provide some, all, or none of these advantages. For example, the plunger assembly may be secured with respect to the waveguide in such a manner that is more secure and accurate than the traditional set screw method of securing the tuning slug. Additionally, the use of a threaded tuning screw that rotates independently of the tuning slug allows for finer adjustments to be made and reduces the risk of over- or under-adjusting the volume of the waveguide. Further, use of a threaded tuning screw may reduce damage to the tuning slug assembly. Other advantages may be readily ascertainable by those of ordinary skill in the art.

BRIEF DESCRIPTION OF THE DRAWINGS

For a more complete understanding of the present invention and the advantages thereof, reference is now made to the following description taken in conjunction with the accompanying drawings.

DETAILED DESCRIPTION OF THE INVENTION

A microwave asher device may employ a waveguide to achieve resonance of electromagnetic waves passing into a plasma generator. To achieve resonance, and minimize reflected energy within the waveguide, a microwave asher device may employ a slug, short, or plunger, which is movable at one end of the waveguide, to finely tune the amplitude of the electromagnetic waves passing through the system after they are generated from a magnetron. Fine tuning the volume of the waveguide allows for minimal power loss due to reflected radiation. Traditional slugs utilize a set screw assembly which must be loosened, thus allowing the slug to be adjusted to allow for the proper amplitude of the electromagnetic radiation being passed through the waveguide. The traditional process of using a set screw to adjust the waveguide slug or plunger is time consuming and may allow excess radiation to escape the waveguide during the tuning process. Among other things, various embodiments of the present invention allow for more precise and accurate adjustment of a waveguide tuning slug.

Figure 1:
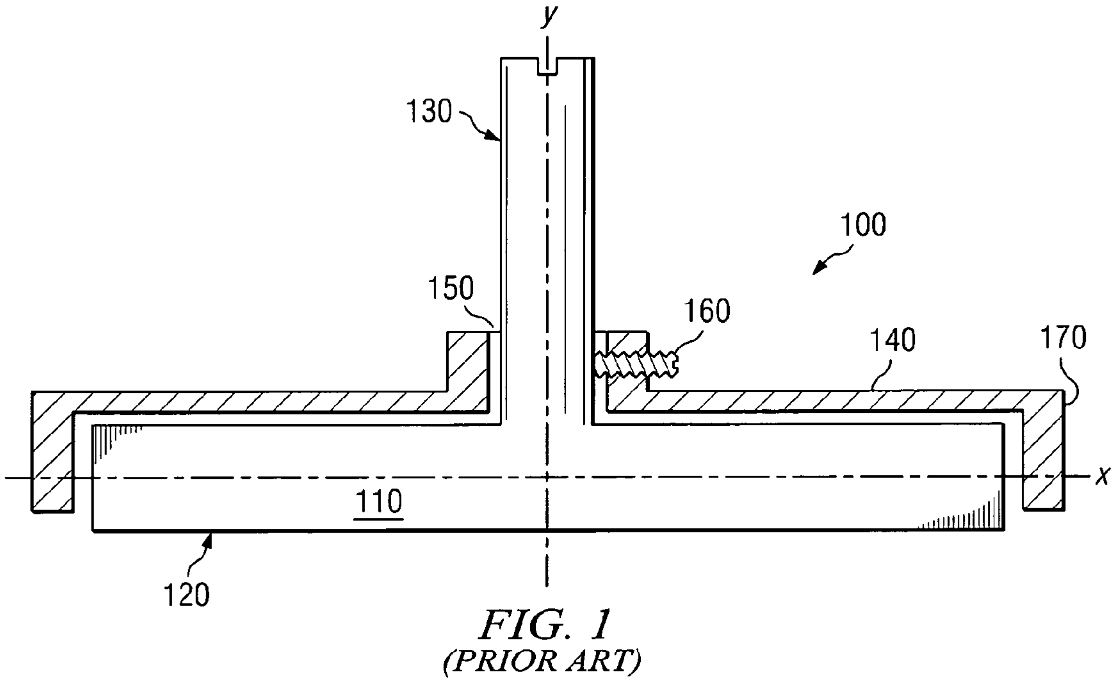
FIG. 1 (PRIOR ART)
FIG. 1 is a cross-sectional view of a prior art waveguide plunger assembly.

FIG. 1 depicts a waveguide tuning slug of the type typically used in current applications. Tuning slug 100 consists of tuning plunger 110 which has a rectangular plate portion 120 and a stem 130. Plunger 110 is positioned at one end of the waveguide 170 through opening 150. To adjust the volume of the waveguide, set screw 160 is typically loosened to allow for movement of plunger 110 along axis y.

Figure 2A:
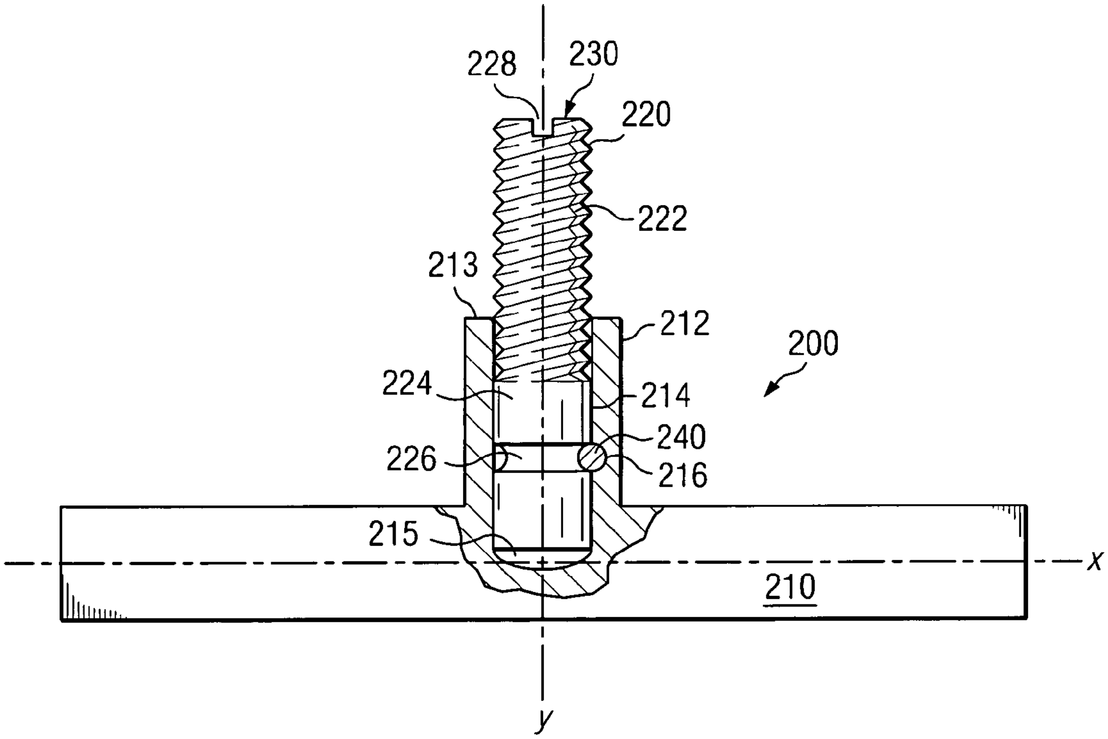
FIG. 2A is a cross-sectional view of a threaded plunger assembly in accordance with an embodiment of the present invention.
Figure 2B:
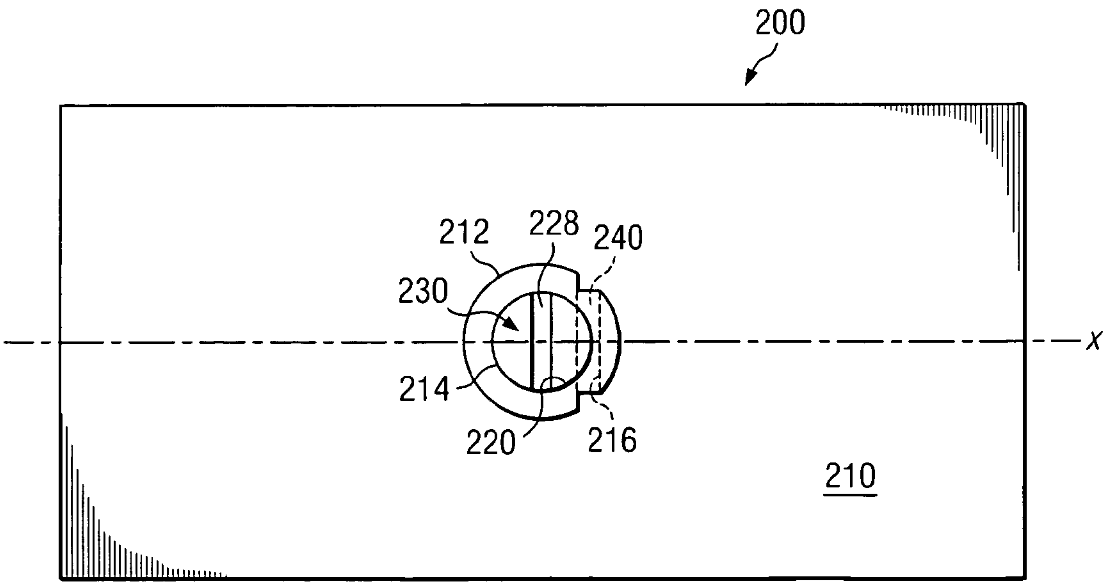
FIG. 2B is a top view of a threaded plunger assembly in accordance with an embodiment of the present invention.

Referring now to FIGS. 2A and 2B, FIG. 2A is a cross-sectional view of a plunger assembly in accordance with an embodiment of the present invention. FIG. 2B is a top view of a plunger assembly in accordance with an embodiment of the present invention. Plunger assembly 200 has a slug plate 210 and a stem 212 extending from slug plate 210. Preferably, stem 212 extends from a central portion of slug plate 210 normal to the plane created by slug plate 210 along axis x. Bore 214 is disposed within stem 212 and extends from a first point 213 at a distal end of stem 212 along axis y to a second point 215 within slug plate 210.

Tuning screw 220 has a threaded portion 222 and a shaft or non-threaded portion 224 and is of a diameter slightly smaller than bore 214, thus allowing the non-threaded portion of tuning screw 220 to be inserted into bore 214. Additionally, tuning screw 220 has an arcuate groove 226 that is cut or otherwise formed in the non-threaded portion of tuning screw 220 to extend around the surface of the non-threaded portion. Groove 226 reduces the diameter of tuning screw 220 sufficiently for a pin 240 to be inserted through a hole 216 in stem 212 of plunger assembly 200 when tuning screw 230 is inserted in the bore 214 of the plunger assembly 200. Finally, a slot or recess 228 is disposed in the distal surface 230 of tuning screw 220 to allow for mechanical manipulation of tuning screw 220. Slot 228 may consist of a single groove cut in distal surface 230 throughout the entire diameter of tuning screw 230, such as would accommodate a typical flathead screwdriver, coin, or other device. Slot 228 may also be in any other shape, such as a box head slot, a cross head slot, a hexagonal slot, or any other geometric configuration which allows for mechanical manipulation.

Figure 3:
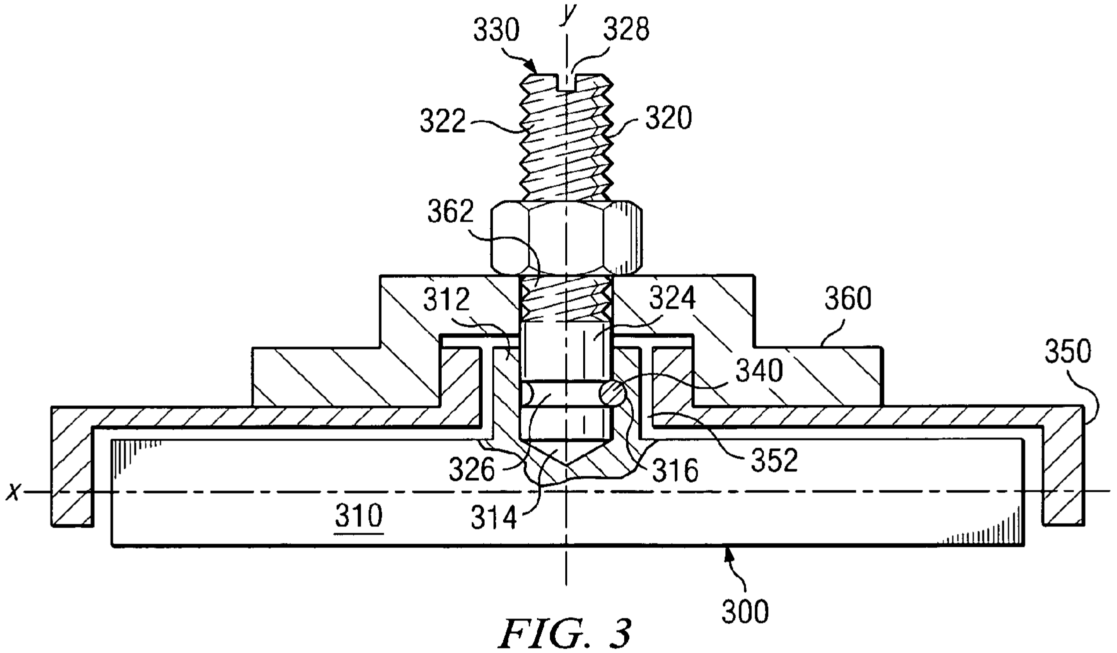
FIG. 3 is a cross-sectional view of a plunger assembly coupled to a waveguide in accordance with an embodiment of the present invention.

FIG. 3 illustrates the threaded plunger assembly coupled to a portion of a waveguide. Plunger assembly 300 includes tuning slug 310, tuning screw 320 with distal surface 330, threaded portion 322 and non-threaded portion 324, waveguide surface 350 with opening 352, slug cap 360 with threaded opening 362, and locking nut 370 which is threaded to match the threads of threaded portion 322 of tuning screw 320. In this embodiment, tuning slug 310 is inserted through opening 352 of waveguide assembly 350. Tuning screw 320 is then inserted, non-threaded portion first, into bore 314 of tuning slug 310. Locking pin 340 is then inserted through hole 316 through tuning slug stem 312 in a position corresponding with, and adjacent to radial groove 326 of tuning screw 320. Slug cap 360 is coupled to waveguide assembly 350, and substantially centered over opening 352. The threaded portion 362 of slug cap 360 has threads designed to mate with the threaded portion 322 of tuning screw 320. Thus, when tuning screw 320 is inserted through threaded slug cap opening 362, movement of slug assembly 300 along an axis y requires rotatably manipulating tuning screw 320 within slug cap 360 at threaded opening 362 of slug cap 360.

When locking pin 340 is inserted through hole 316 of slug stem 312 corresponding with radial groove 326 of tuning screw 320, tuning screw 320 may rotate freely irrespective of the position of tuning slug 310. Therefore, locking pin 340, hole 316, and radial groove 326 combine as a coupling assembly allowing tuning screw 320 to be rotatably coupled to tuning slug 310. When manipulating tuning screw 320 in a clockwise or counter-clockwise direction about an axis y disposed longitudinally through the center of tuning screw 320, threaded portion 322 of tuning screw 320 engages threaded opening 362 of slug cap 360 to allow movement of tuning slug 310 along axis y. Once a desired position of tuning slug 310 is achieved along axis y, locking nut 370 may be rotatably attached to tuning screw 320 by engaging threaded portion 322 of tuning screw 320. Threaded locking nut 370 may then be disposed adjacent to slug cap 360 to prevent any movement along axis y of tuning slug 310.

Although the present invention has been described in detail, it should be understood that various changes, substitutions, and alterations may be made, without departing from the spirit and scope of the present invention as defined by the claims. For example, multiple holes 316 and multiple pins 340 may be inserted through tuning slug stem 312 at radial groove 326 of tuning screw 320 to provide an additional coupling assembly to further rotatably couple tuning screw 320 to tuning screw 310.

What is claimed is:

1. A waveguide assembly comprising;

a waveguide;

a tuning slug having a stem extending therefrom;

a tuning screw rotatably disposed within a bore formed in the stem of the tuning slug and rotatably coupled to the tuning slug with a coupling assembly;

a threaded waveguide cap coupled to the waveguide, the tuning screw threaded through the waveguide cap and rotatable to adjust a position of the tuning slug within the waveguide, the coupling assembly operable to allow rotation of the tuning screw while maintaining a longitudinal position of the tuning screw with respect to the tuning slug.

2. The assembly of claim 1, wherein the stem of the tuning slug extends from approximately the center of the tuning slug.

3. The system of claim 1, the stem having an aperture formed through a surface thereof, the tuning screw having a non-threaded portion with an arcuate groove formed therein, and wherein the coupling assembly comprises a pin extending through the hole and at least partially disposed within the arcuate groove to maintain the longitudinal position of the tuning screw with the tuning slug.

4. The system of claim 1, wherein the threaded portion of the tuning screw is operable with the threaded portion of the threaded slug cap to change the position of the tuning slug along the longitudinal axis of the stem when the tuning screw is rotated.

5. The system of claim 1, further comprising:

a locking nut threaded to match the threads of the tuning screw, operable to fix the position of the slug assembly along the longitudinal axis of the tuning slug.

6. The system of claim 5, wherein the the locking nut is operable to be rotatably disposed adjacent to the tuning slug cap to prevent movement of the tuning slug along the longitudinal axis of the tuning screw.

7. The system of claim 5, wherein the tuning screw rotates independently of the tuning slug.

* * * * *